United States Patent
Han et al.

(10) Patent No.: US 7,283,376 B2
(45) Date of Patent: Oct. 16, 2007

(54) MOUNTING APPARATUS FOR EXPANSION CARDS

(75) Inventors: Shao-Bo Han, Shenzhen (CN); Zhen Kang, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 323 days.

(21) Appl. No.: 11/019,329

(22) Filed: Dec. 21, 2004

(65) Prior Publication Data

US 2005/0265005 A1   Dec. 1, 2005

(30) Foreign Application Priority Data

Jan. 6, 2004   (TW) ............................... 93200161 U

(51) Int. Cl.
*H05K 7/12* (2006.01)
(52) U.S. Cl. ...................... 361/801; 361/759; 361/747; 361/740; 361/726; 361/732; 312/223.2
(58) Field of Classification Search ................ 361/726, 361/732, 740, 747, 756, 759, 801; 312/223.2, 312/223.3
See application file for complete search history.

(56) References Cited

U.S. PATENT DOCUMENTS

| | | | | |
|---|---|---|---|---|
| 6,094,358 A | * | 7/2000 | Christensen et al. | 361/785 |
| 6,115,258 A | * | 9/2000 | Hoyle et al. | 361/752 |
| 7,002,811 B2 | * | 2/2006 | Jing et al. | 361/801 |
| 7,120,032 B2 | * | 10/2006 | Lin et al. | 361/801 |

* cited by examiner

*Primary Examiner*—Dean A. Reichard
*Assistant Examiner*—Dameon E. Levi
(74) *Attorney, Agent, or Firm*—Morris Manning Martin LLP; Tim Tingkang Xia, Esq.

(57) ABSTRACT

A mounting apparatus for expansion cards (80) comprises a bracket (20), a pair of sliding members (40) and a retainer (60). The bracket staying in the chassis (90) of a computer comprises a main body (22), at the edge of the main body extends inwardly a first guiding part (224). A sliding portion (42) and a clasp portion (48) are formed on each sliding member. The sliding portion can engage in the first guiding part slidably, a post (482) protrudes outwardly from each clasp portion. The retainer comprises a rear wall (62), a serial of slots are defined on the rear wall successively for the posts to slide in. The retainer moves up and down when the posts slide in the slots.

20 Claims, 7 Drawing Sheets

US 7,283,376 B2

MOUNTING APPARATUS FOR EXPANSION CARDS

CROSS-REFERENCE TO RELATED APPLICATIONS

This application is related to U.S. patent application Ser. No. 10/948,531, entitled "MOUNTING APPARATUS FOR EXPANSION CARDS", filed on Sep. 22, 2004 with the same assignee as the instant application. The disclosure of the above identified application is incorporated herein by reference.

BACKGROUND OF THE INVENTION

1. Field of the Invention

The present invention relates to a mounting apparatus, and particularly to a mounting apparatus for steadily and securely mounting expansion cards in a computer chassis.

2. Description of the Related Art

Many computers comprises not only a motherboard, but also one or more expansion cards electronically connected on the motherboard to provide specialized functions. It is required that the expansion cards be reliably retained with in the computer enclosure to prevent disengagement from the motherboard when the computer is subject to shock and vibration during delivery and use thereof.

Conventionally, the expansion cards are attached to the motherboard upright. This requires the computer enclosure very thick. But nowadays the trend of the computer enclosure is small and thin. One approach to addressing this problem is to arrange an intermediate riser card on the motherboard and attach a plurality of expansion cards thereto. Thereby, each expansion card is positioned parallel to the motherboard.

Such an arrangement for expansion cards is disclosed in U.S. Pat. No. 5,835,346. A computer chassis is partitioned into first and second regions by a partition wall. A motherboard is positioned within the first region along a bottom wall of the chassis. A riser card interfaces with the motherboard. A series of horizontal expansion card interfaces are located above each other on the riser card within the first region of the enclosure each for interfacing with a corresponding expansion card and to position the expansion cards horizontally over the motherboard. However, the riser card is inserted in the motherboard and the expansion cards are inserted in the riser cards. When the computer is subject to or shock, the riser cards and the option cards are prone to be loosed or detached from the motherboard.

Thus, an improved mounting apparatus for expansion cards which overcomes the above-mentioned problems is desired.

BRIEF SUMMARY OF THE INVENTION

Accordingly, an object of the present invention is to provide a mounting apparatus for readily and securely installing and removing expansion cards to and from equipment such as a chassis of a computer.

To achieve the above object, the mounting apparatus for expansion cards comprises a bracket, a pair of sliding members and a retainer. The bracket staying in a chassis of a computer comprises a main body, a first guiding part extends inwardly from the edge of the main body. Each sliding member comprises a sliding portion and a clasp portion. The sliding portion engages in the first guiding part slidably, a post protrudes outwardly from each clasp portion. The retainer comprises a rear wall, a serial of slots are defined on the rear wall successively for the posts to slide in, the retainer moves up and down when the posts slide in the slots.

A principal advantage of this embodiment is that the mounting apparatus of the expansion cards can hold a plurality of expansion cards at the same time and can make the installation quicker and easier.

Other objects, advantages and novel features of the present invention will become more apparent from the following detailed description when taken in conjunction with the accompanying drawings, in which:

DETAILED DESCRIPTION OF THE INVENTION

Figure 1:
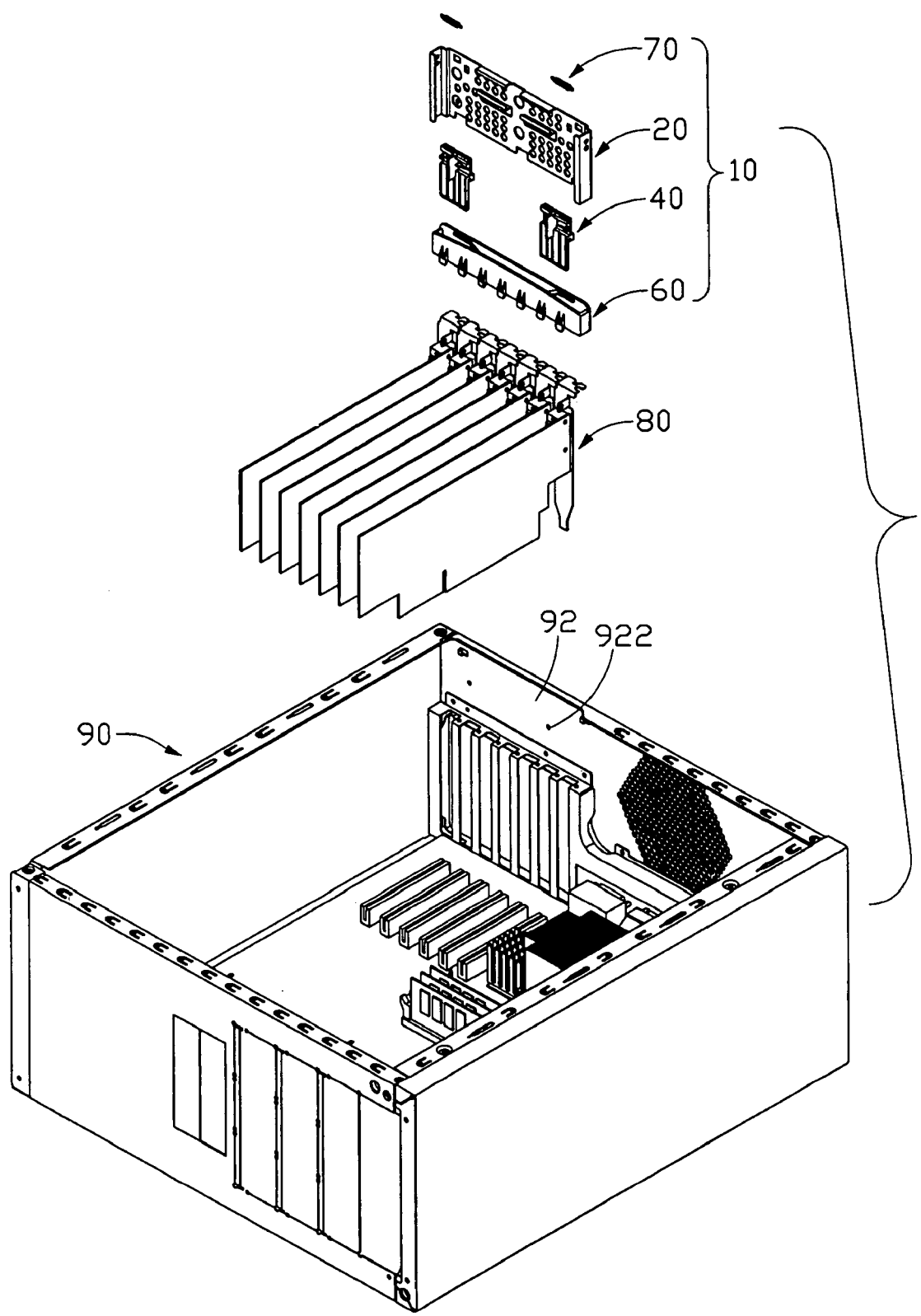
FIG. 1 is an exploded, isometric view of a mounting apparatus in accordance with the preferred embodiment of the present invention, together with a computer chassis with a plurality of expansion cards.
Figure 2:
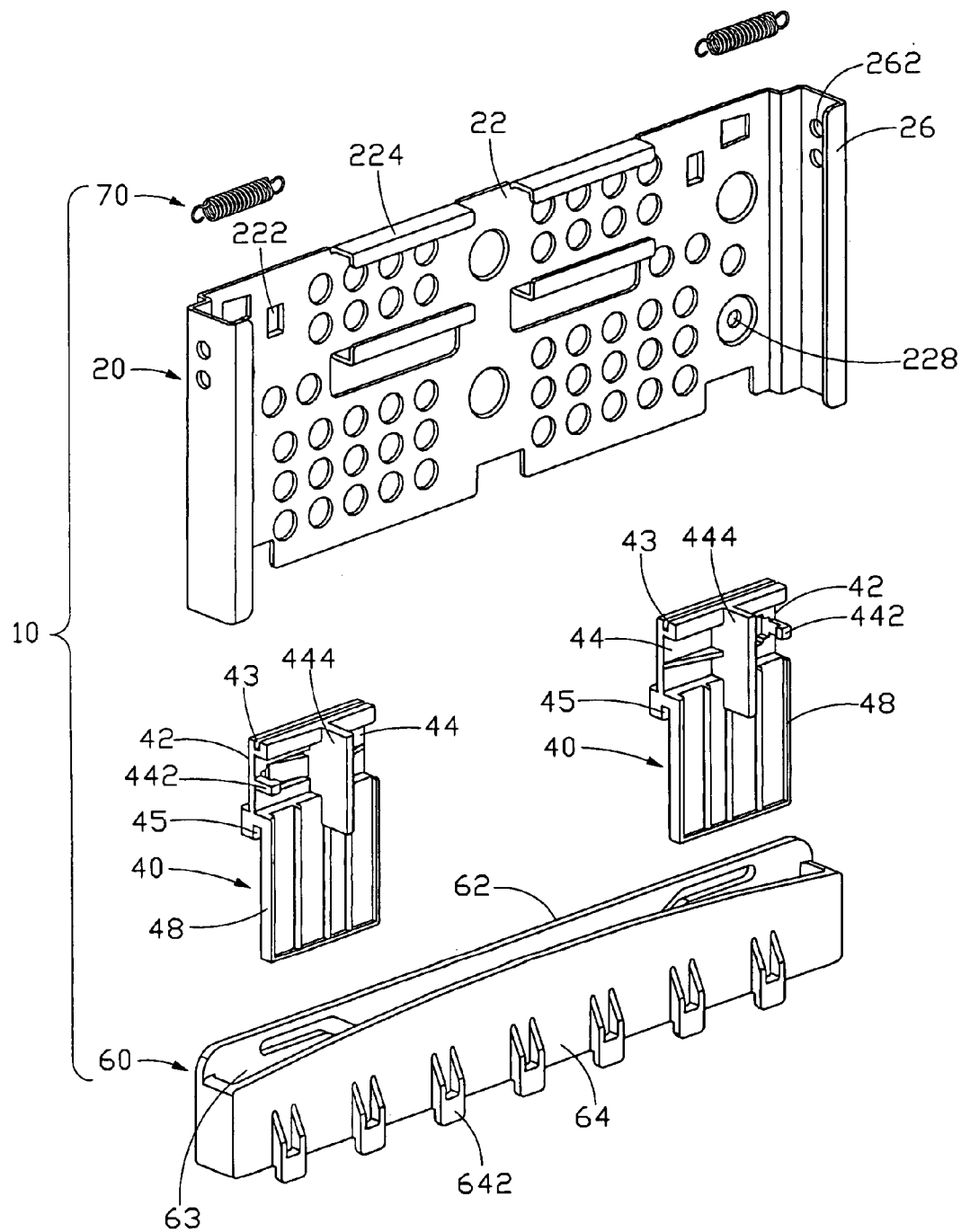
FIG. 2 is an exploded view of the retaining device of FIG. 1.
Figure 3:
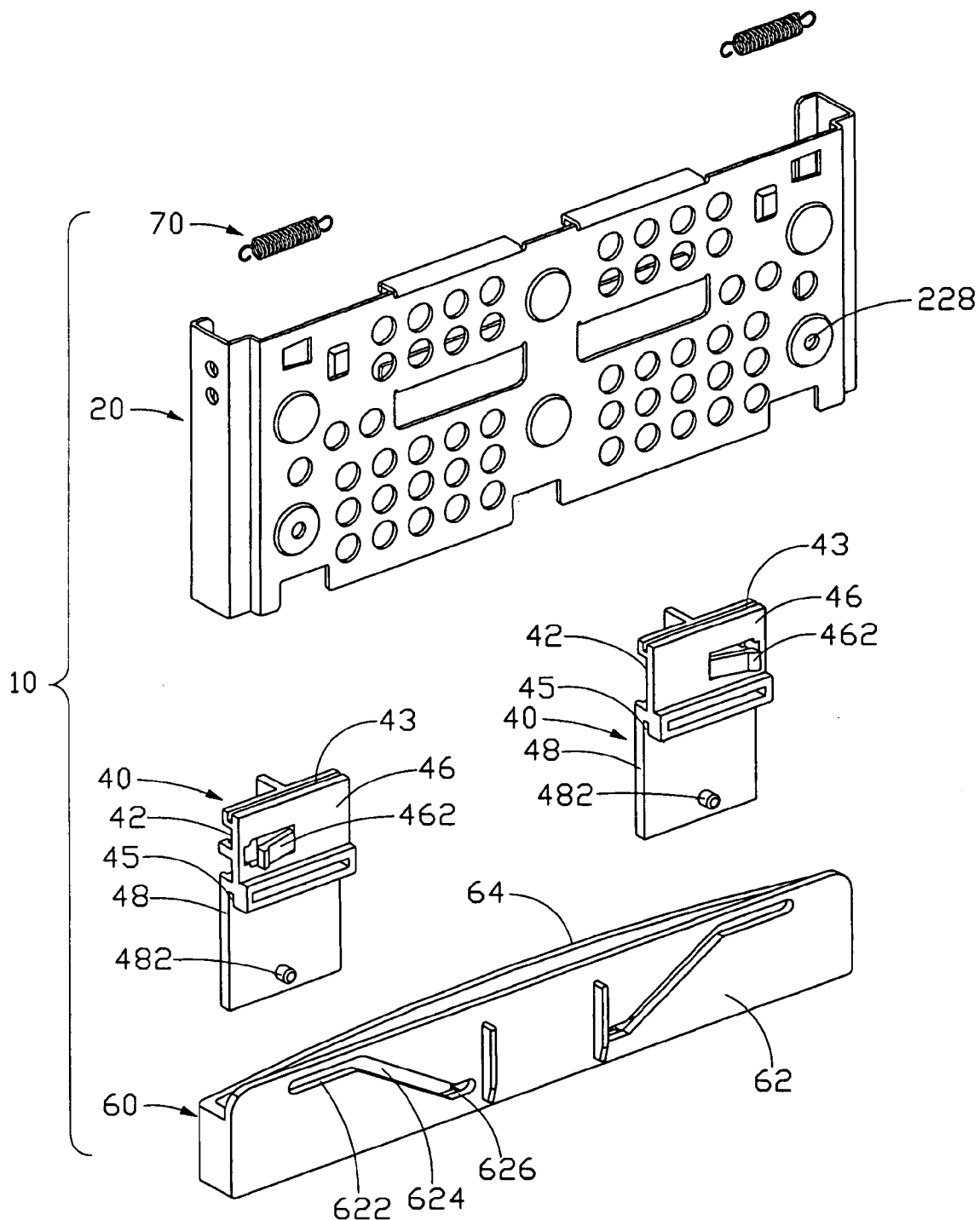
FIG. 3 is an exploded view of the retaining device of FIG. 1, but viewed from another aspect.
Figure 4:
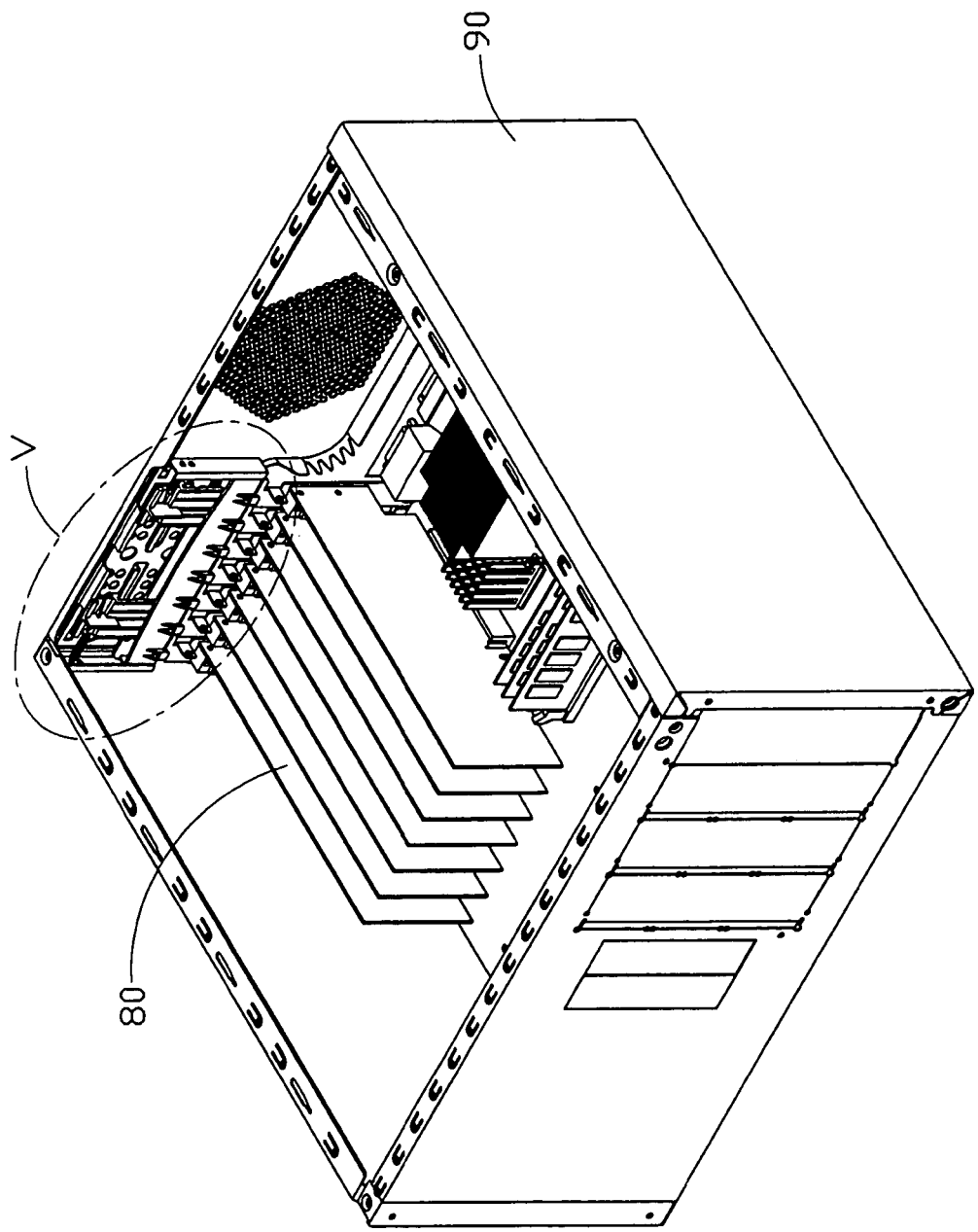
FIG. 4 is an isometric view illustrating the chassis with the expansion cards in a locked position.
Figure 5:
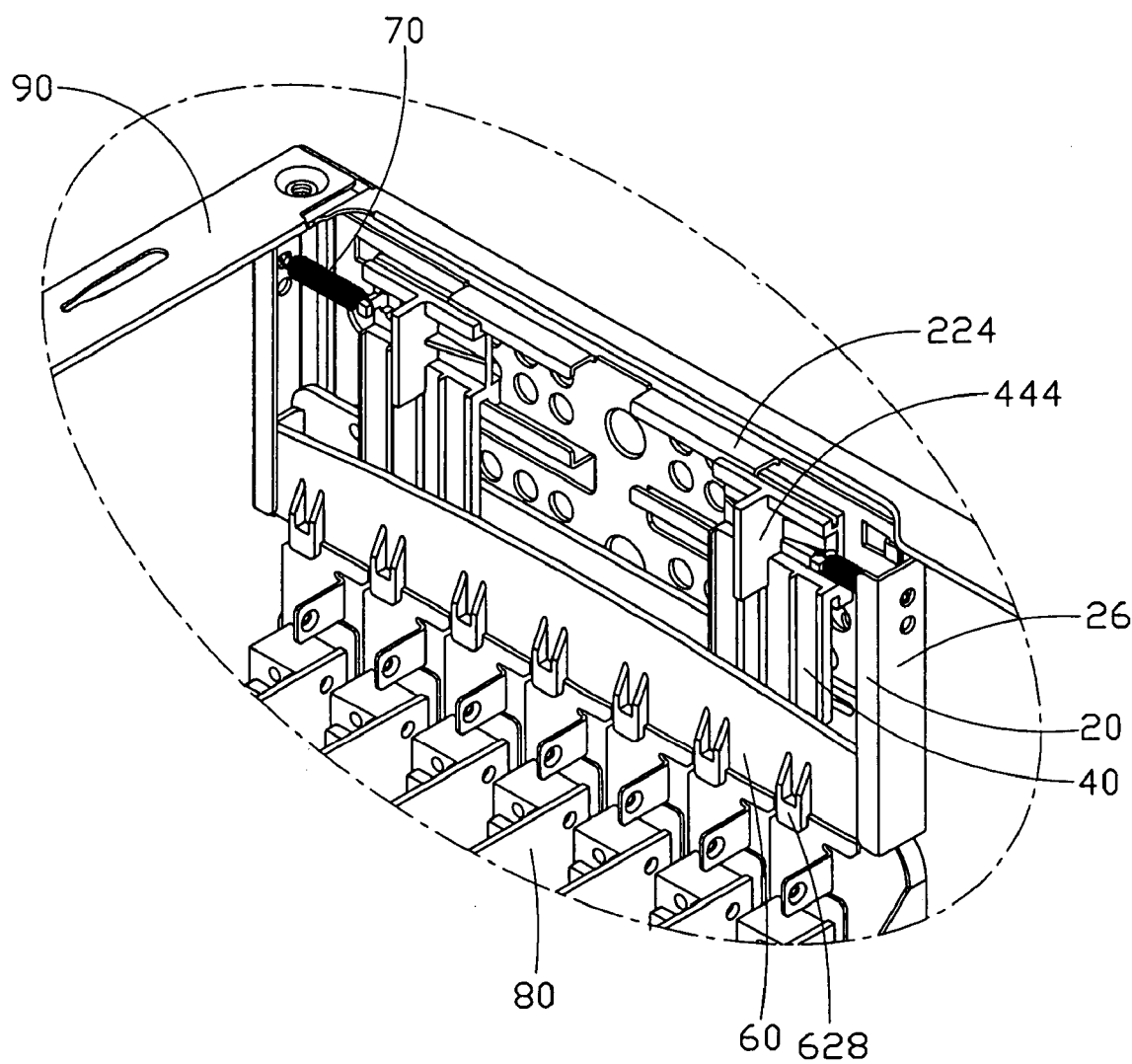
FIG. 5 is an enlarged view taken from the encircled portion V of FIG. 4.

Referring to FIGS. 1 to 3, a mounting apparatus in accordance with the preferred embodiment of the present invention is used to fix expansion cards 80 to a chassis 90 of an electronic device like a computer by a retaining device 10, wherein the retaining device 10 comprises a bracket 20, two sliding members 40, a retainer 60 and two springs 70.

The bracket 20 comprises a main body 22. A pair of apertures 222 are defined in the main body 22. A pair of first guiding parts 224 are formed on an upper edge of the main body 22. Two second guiding parts 26 are formed along two opposite sides of the main body 22. A through hole 262 is defined in each second guiding part 26 for the spring 70 to be engaged in. The main body 22 further defines a pair of fixing holes 228.

The two sliding members 40 are same in structure and each comprise a sliding portion 42 and a clasp portion 48. Corresponding to the first guiding parts 224 on the bracket 20, one guide slot 45 is defined at the joint of the sliding portion 42 and the clasp portion 48, the other guiding slot 43 is defined in a top of the sliding member 40. The sliding portion 42 comprises a first side 44 and a second side 46. An operation part 444 is formed on the first side 44. A clasp 442 extends outward from the edge of the first side 44, for fixing one end of the spring 70. An elastic finger 462 extends from the second side 46 for engaging the apertures 222. A post 482 protrudes outwards from the clasp portion 48.

The retainer 60 comprises a rear wall 62 and a front wall 64. A pair of sliding slots are defined separately in the plane of the rear wall 62. Each of the sliding slots includes three parts: a first horizontal part 626, a slanted part 624 and a second horizontal part 622. A plurality of pressing tabs 642 extends outward from one edge of the front wall 62, which is used to press the expansion cards 80. Between the rear wall 62 and the front wall 64 a receiving chamber 63 is defined for receiving the sliding members 40.

The chassis 90 comprises a rear plate 92. The rear plate 92 defines a pair of locking holes 922 corresponding to the fixing holes 228 of the bracket 20.

Referring to FIGS. 1-5, when assembling the retaining device 10, the posts 482 of the sliding members 40 are inserted into the sliding slots of the retainer 60. The retainer 60 is pushed into the bracket 20 along the second guiding parts 26, and the sliding members 40 slide into the first guiding parts 224 and are contained by the first guiding parts 224. The springs 70 are fixed to the bracket 20 by the through holes 262 and clasps 442. Because of the springs 70, the sliding members 40 are slid toward two ends of the bracket 20 until the elastic fingers 462 stay in the corresponding apertures 222. At the same time, the retainer 60 moves downward in the force of the posts 482, and the posts 482 stay in the corresponding second horizontal parts 622 of the retainer 60. The bracket 20 is fastened to the chassis 90 by conventional means such as screws extending through the fixing holes 228 and engaging in the corresponding locking holes 922.

When assembling the expansion cards 80, the two operation parts 444 of the sliding members 40 are pushed toward each other, the post 482 of each sliding member 40 slides from the second horizontal part 622 to the first horizontal part 626 along the slanted part 624, and the retainer 60 is moved upward. The expansion cards 80 are put into expansion slots of the chassis 90, the operation parts 444 are released. The sliding members 40 are then moved toward the two ends of the bracket 20 in the force of the springs 70 and drive the posts 482 to slide from the corresponding first horizontal parts 626 to the second horizontal parts 622 along the slanted parts 624, thereby forcing the retainer downward.

Figure 6:
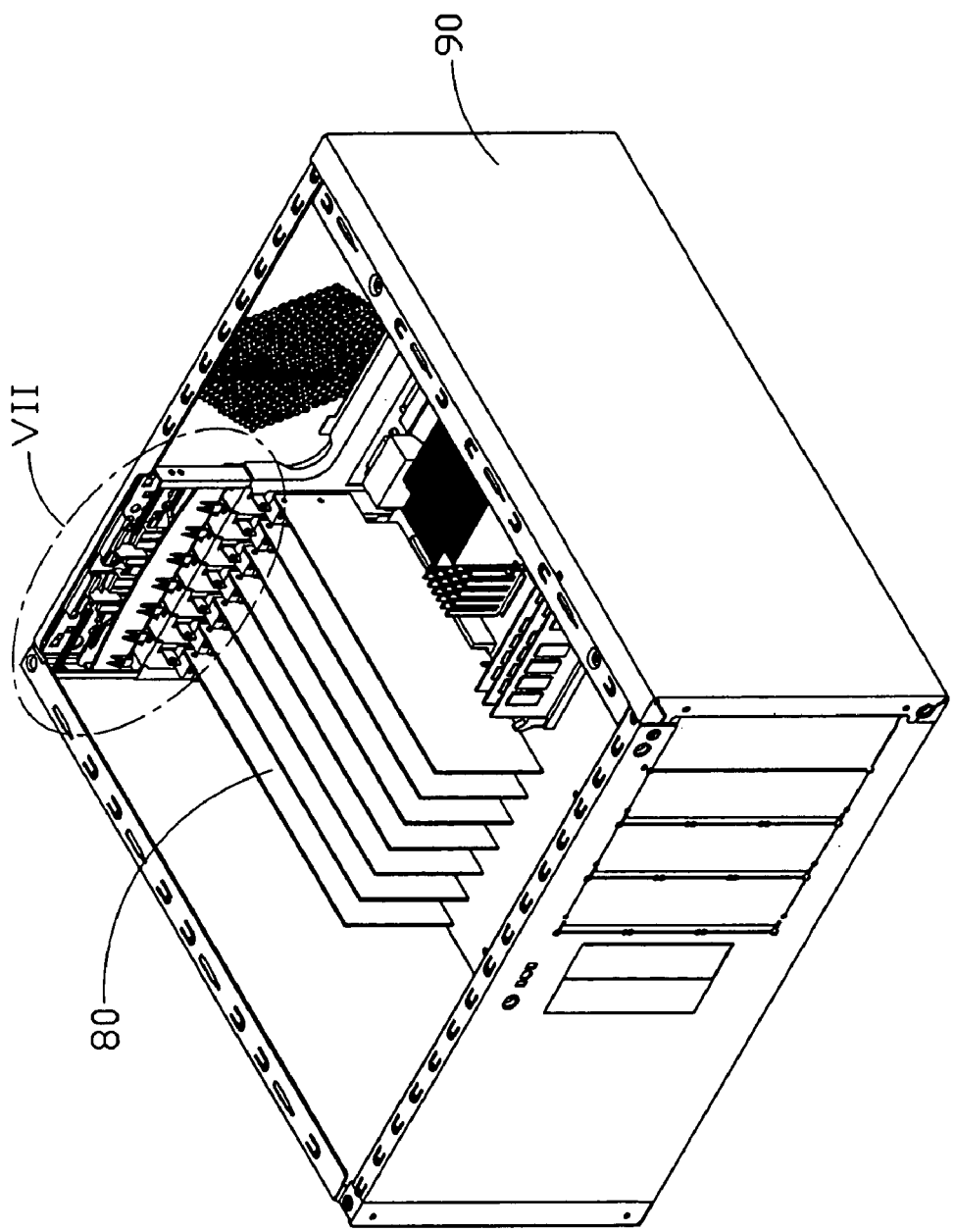
FIG. 6 is an isometric view illustrating the chassis with the expansion cards in an unlocked position.
Figure 7:
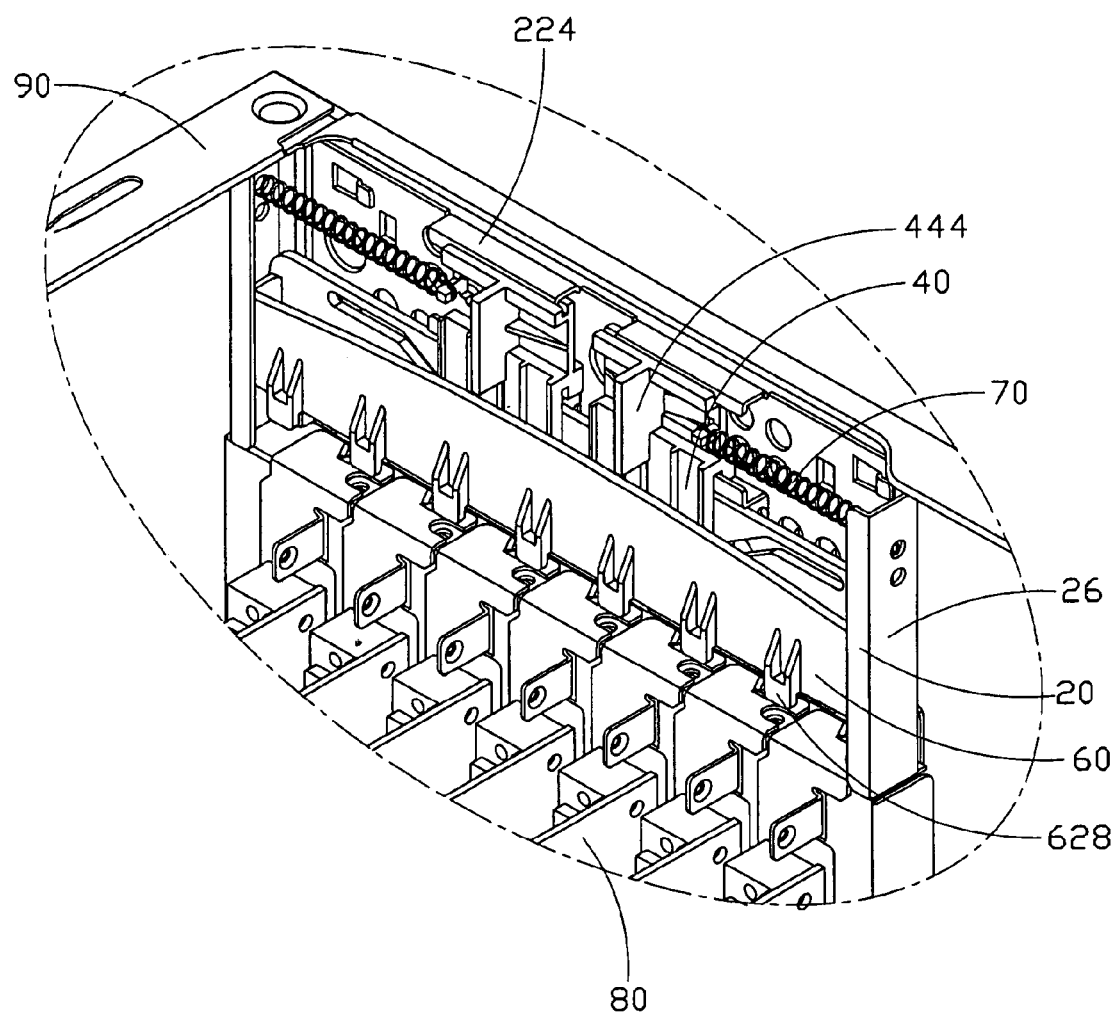
FIG. 7 is an enlarged view taken from the encircled portion VII of FIG. 6.

Referring to FIGS. 6-7, when disassembling the expansion cards 80 from the expansion slots, the operation parts 444 are pressed toward each other. The posts 482 slide from the corresponding second horizontal parts 622 to the first horizontal parts 626 along the slanted parts 624. The retainer 60 is moved upward and the expansion cards 80 are released to be pulled out from the expansion slots.

In another embodiment, the bracket 20 can also be a part of the rear plate of the chassis 90, while the structure and the function is similar to said bracket 20 in the preferred embodiment.

It is to be understood, however, that even though numerous characteristics and advantages of the present invention have been set forth in the foregoing description, together with details of the structure and function of the invention, the disclosure is illustrative only, and changes may be made in detail, especially in matters of type, arrangement of components within the principles of the invention to the full extent indicated by general meaning of the terms in which the appended claims are expressed.

What is claimed is:

1. A mounting apparatus adapted for positioning expansion cards to a computer chassis, the mounting apparatus comprising:
    a bracket arranged on the chassis, a first guiding part bent inwardly from the bracket;
    a pair of sliding members each forming a sliding portion and a clasp portion, the sliding portion slidably engaging in the first guiding part, the clasp portion forming a post outwardly; and
    a retainer adapted to position the expansion cards, comprising a rear wall, the rear wall defining a pair of slanted slots to slidably contain the posts;
    wherein when the posts of the sliding members slide in the slanted slots of the retainer, the retainer is driven to move up and down.

2. The mounting apparatus as claimed in claim 1, wherein an upper guiding slot is defined in an upper edge of the sliding portion to receive the first guiding part.

3. The mounting apparatus as claimed in claim 1, wherein a lower guiding slot is defined at the joint of the sliding portion and the clasp portion, an upper guiding slot is defined in an upper edge of the sliding portion, the lower and upper guiding slots retain the first guiding part.

4. The mounting apparatus as claimed in claim 1, wherein a second guiding part is formed from each of two opposite sides of the bracket for slidably receiving the retainer.

5. The mounting apparatus as claimed in claim 1, wherein an operation part is formed from each of the sliding members.

6. The mounting apparatus as claimed in claim 1, further comprising a pair of springs slidably connecting the sliding members with the bracket.

7. The mounting apparatus as claimed in claim 1, wherein a pair of apertures are defined in the bracket, an elastic finger is formed on each of the sliding portions for engaging in a corresponding aperture.

8. The mounting apparatus as claimed in claim 1, wherein two horizontal portions extend from two ends of each of the slanted slots respectively.

9. A mounting apparatus comprising:
    a computer chassis comprising a rear plate, a bracket arranged on the rear plate;
    a plurality of expansion cards adapted to be attached to the rear plate;
    at least one sliding member comprising a sliding portion slidably engaging with the bracket and a clasp portion, the clasp portion forming a post outwardly; and
    a retainer adapted to position the expansion cards, comprising a rear wall, the rear wall defining a slanted slot to contain the post slidably;
    wherein the post of said sliding member slides along the slanted slot of the retainer to a locked position, the retainer is driven downwardly to press the expansion cards to the rear plate.

10. The mounting apparatus as claimed in claim 9, wherein the bracket comprises a main body, a first guiding part extending outwardly from the edge of the main body.

11. The mounting apparatus as claimed in claim 10, wherein a lower guiding slot is defined at the joint of the sliding portion and the clasp portion, an upper guiding slot is defined in an upper edge of the sliding portion, the lower and upper guiding slots retain the first guiding part.

12. The mounting apparatus as claimed in claim 10, wherein an aperture is defined in the main body, an elastic finger is formed on the sliding portion to engage in the aperture in the locked position.

13. The mounting apparatus as claimed in claim 10, wherein a second guiding part is formed from each of two opposite sides of the main body for slidably receiving the retainer.

14. The mounting apparatus as claimed in claim 9, wherein an operation part is formed from said sliding member.

15. The mounting apparatus as claimed in claim 9, wherein the mounting apparatus further comprises a spring slidably connecting said sliding member with the bracket.

16. The mounting apparatus as claimed in claim 9, wherein two horizontal portions extend from two ends of each of the slanted slots respectively.

17. A mounting apparatus for a chassis of an electronic device to secure a plurality of extension cards therein, comprising:
- a rear plate defined in said chassis so as to have said plurality of extension cards adapted to abut against said rear plate;
- a retainer disposed next to said plurality of extension cards, and engagable with each of said plurality of extension cards along an engaging direction approaching toward said plurality of extension cards in order to hold said each extension card abutting against said rear plate;
- at least one sliding member drivably engagable with said retainer, and linearly movably attached to said rear plate between a first position thereof where said retainer is driven by said at least one sliding member to engage with said each extension card and a second position thereof where said retainer is driven by said at least one sliding member to disengage from said each extension card, along a direction perpendicular to said engaging direction of said retainer.

18. The mounting apparatus as claimed in claim 17, wherein a bracket is formed on said rear plate and said at least one sliding member is attached to said rear plate via said bracket.

19. The mounting apparatus as claimed in claim 17, wherein another sliding member is juxtaposed with said at least one sliding member beside said retainer for driving said retainer to engage with said each extension card together with said at least one sliding member when said another sliding member and said at least one sliding member move away from each other.

20. The mounting apparatus as claimed in claim 17, wherein a sliding slot is formed in said retainer to allow a post of said at least one sliding member movably receivable therein in order for performing drivable engagement between said retainer and said at least one sliding member.

* * * * *